United States Patent
Savignac et al.

(10) Patent No.: US 6,307,263 B1
(45) Date of Patent: Oct. 23, 2001

(54) INTEGRATED SEMICONDUCTOR CHIP WITH MODULAR DUMMY STRUCTURES

(75) Inventors: Dominique Savignac, Ismaning; Helmut Schneider, München, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/363,263

(22) Filed: Jul. 29, 1999

(30) Foreign Application Priority Data

Jul. 29, 1998 (DE) .............................. 198 34 234

(51) Int. Cl.[7] .......................... H01L 23/48; H01L 23/52; H01L 29/40
(52) U.S. Cl. .......................... 257/734; 257/756; 257/776; 257/798
(58) Field of Search .................. 257/734, 756, 257/776, 798

(56) References Cited

U.S. PATENT DOCUMENTS

| 4,937,649 | 6/1990 | Shiba et al. | 257/207 |
|---|---|---|---|
| 5,464,992 | 11/1995 | Okabe et al. | 257/139 |
| 5,464,996 | * 11/1995 | Hynecek | 257/230 |
| 5,659,202 | * 8/1997 | Ashida | 257/758 |
| 5,686,338 | * 11/1997 | Liu | 257/904 |
| 5,747,380 | 5/1998 | Yu et al. | 438/599 |
| 5,945,740 | * 8/1999 | Kawazoe | 257/776 |

FOREIGN PATENT DOCUMENTS

| 0 567 694 A1 | 11/1993 | (EP) . |
|---|---|---|
| 0567694A1 | 11/1993 | (EP) . |
| 0692824A2 | 1/1996 | (EP) . |

OTHER PUBLICATIONS

International publication WO 97/35344 (Jarstad et al.), dated Sep. 25, 1997.

* cited by examiner

Primary Examiner—Jhihan B Clark
(74) Attorney, Agent, or Firm—Herbert L. Lerner; Laurence A. Greenberg; Werner H. Stemer

(57) ABSTRACT

For an integrated semiconductor chip to operate reliably, it is necessary to homogenize a substrate potential as far as possible in all regions of the chip. In order to improve the substrate contact-connections on the chip, modular dummy structures are configured in such a way that, in addition to homogenizing the areal occupancy of the chip, they form extensive electrically conductive contact between the substrate and metal interconnects of a metallization plane of the chip. This achieves homogenization of the substrate potential and improvement of the wave guiding properties of wiring planes lying above the dummy structures without an additional process step or an additional chip area being required for this purpose.

7 Claims, 2 Drawing Sheets

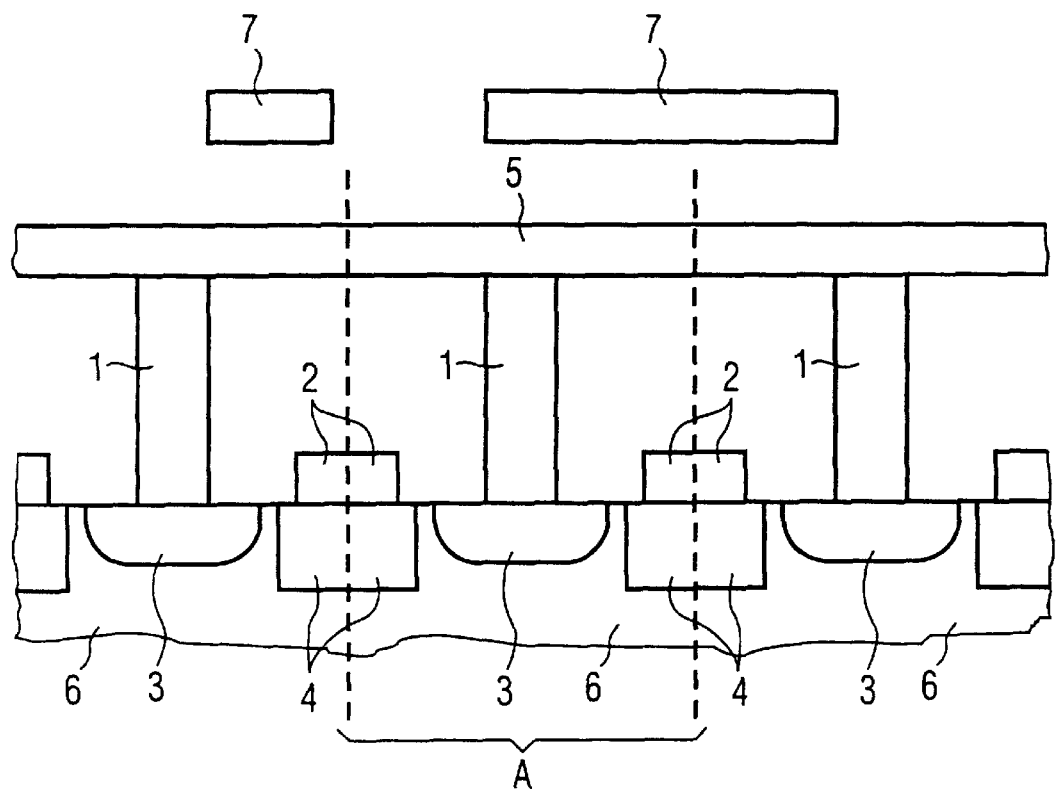

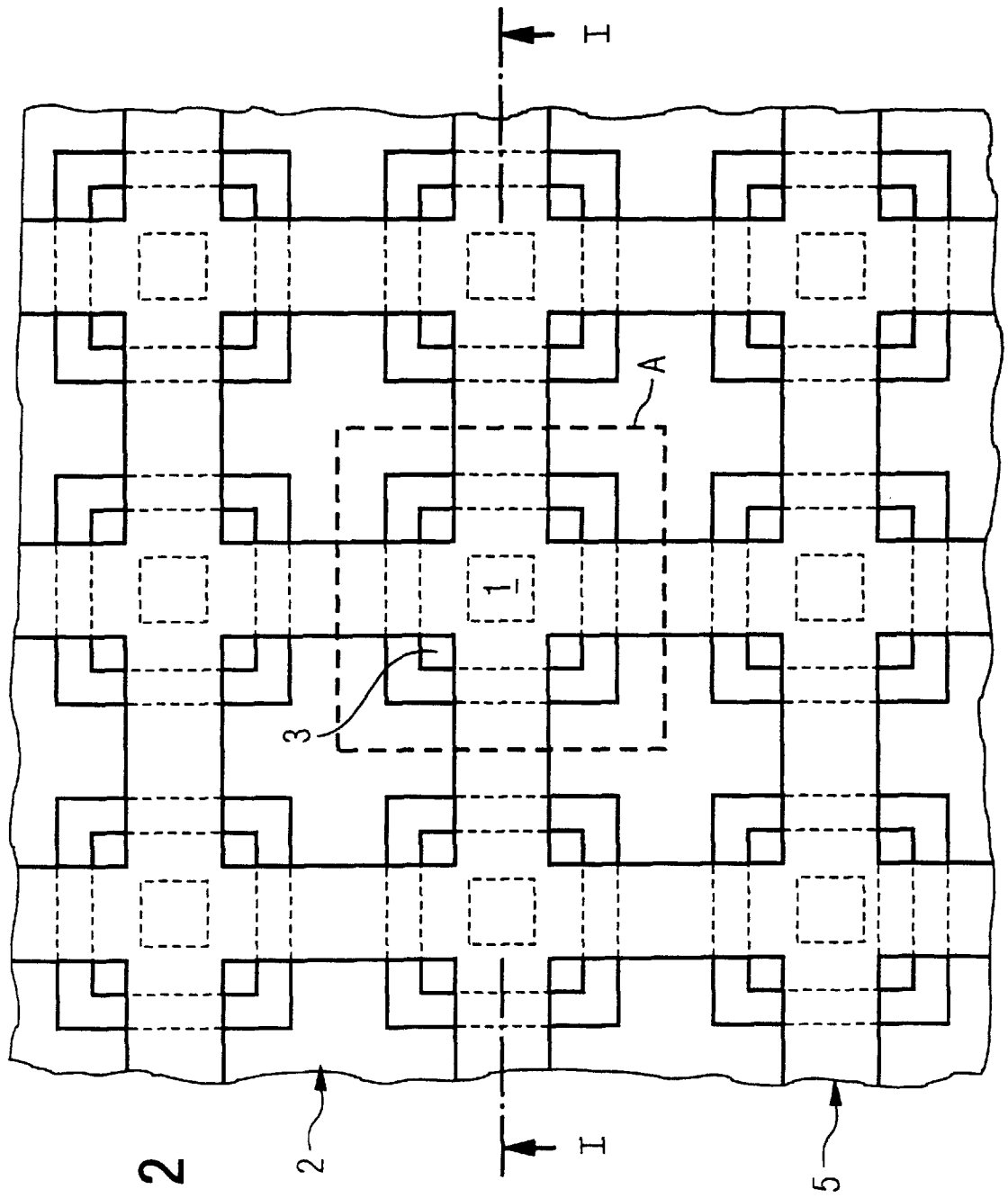

INTEGRATED SEMICONDUCTOR CHIP WITH MODULAR DUMMY STRUCTURES

BACKGROUND OF THE INVENTION

Field of the Invention

The present invention relates to an integrated semiconductor chip.

If the area (layout structure) of an integrated semiconductor chip is considered, it is generally possible to identify so-called active regions and inactive regions on account of the structural differences in the topmost layer. By way of example, components or functional groups (for example transistors, memory cells) which effect a functionality of the semiconductor chip are disposed in the active regions; by contrast, no components or functional groups are contained in the inactive regions. With regard to the topographic construction of integrated semiconductor chips, modern fabrication processes require, in particular, homogeneous areal occupancy in all of the relevant process planes from the substrate up to and including a first metallization plane Therefore, the structural configuration of the process planes should largely be similar in the active and inactive regions of the chip. For this purpose, so-called modular dummy structures are provided within the inactive regions in the above mentioned process planes, the dummy structures being constructed similarly to the structures of the active regions. The use of modular dummy structures is already a common practice. They are primarily used for the following three reasons, reiterated briefly using key words:

a) for the production of identical layer hardnesses over the entire chip area by use of homogeneous areal occupancy underneath the respective topmost layer, important with regard to chemical mechanical polishing (CMP) and "Dishing";

b) for homogenization of exposure illumination and defraction effects over the entire chip area, optical proximity effect (OPE); and c) for homogenization and improvement of the etching process over the entire chip area, reactive ion etch (RIE) and "Micro Loading".

For the operation of the semiconductor chip, it is desirable to homogenize the substrate potential of the chip as well as possible. The effect achieved by doing this is that the substrate potential is distributed uniformly for all components applied on the substrate. This results in a better, more uniform voltage supply for all the components distributed over the chip area. The wave propagation properties of voltage pulses on the electrical conductors are more predictable and more homogeneous against a uniform potential. Therefore, the wave guiding properties of superior wiring planes are also improved by a uniform substrate potential. Attempts have previously been made to achieve homogenization of the electrical substrate potential by using epitaxial substrates and by use of additional substrate contacts in the individual circuits. The known "latch-up" effect can be diminished, moreover, by using epitaxial substrates. One disadvantage of this procedure is that the application of the epitaxial layer to the substrate necessitates an additional, costly process step in the course of the fabrication process.

SUMMARY OF THE INVENTION

It is accordingly an object of the invention to provide an integrated semiconductor chip with modular dummy structures that overcomes the above-mentioned disadvantages of the prior art devices of this general type, in which an extensive homogenization of the substrate potential conditions on an integrated semiconductor chip are achieved and at the same time, the corresponding outlay in the course of the chip fabrication process is minimized.

With the foregoing and other objects in view there is provided, in accordance with the invention, an integrated semiconductor chip, including a substrate and modular dummy structures disposed on the substrate and include a metallization plane with metal interconnects and a multiplicity of electrically conductive contact points disposed between the metal interconnects of the metallization plane and the substrate in areas of a chip area over which the dummy structures extend.

In accordance with an added feature of the invention, the modular dummy structures include a multiplicity of mutually identical sections, and one of the multiplicity of electrically conductive contact points is disposed between the metal interconnects of the metallization plane and the substrate in each of the multiplicity of mutually identical sections.

In accordance with an additional feature of the invention, each of the multiplicity of mutually identical sections, includes: a portion of the substrate corresponding to a size of a respective section of the multiplicity of mutually identical sections; zones formed of polysilicon disposed above the substrate; a doping zone disposed in the substrate and spaced apart from the zones formed of polysilicon; and one of the multiplicity of electrically conductive contact points electrically conductively connected to the doping zone and to the metal interconnects of the metallization plane.

In accordance with another feature of the invention, the substrate has trenches formed therein disposed underneath the zones formed of polysilicon and including an oxide filling the trenches resulting in oxide-filled trenches.

In accordance with a further added feature of the invention, the doping zone and the substrate are composed of doped silicon having a same doping polarity, the doped silicon in the doping zone being doped with a high concentration and the doped silicon in the substrate being doped with a low concentration.

In accordance with a further additional feature of the invention, the zones formed of polysilicon and the oxide-filled trenches of neighboring sections of the multiplicity of mutually identical sections of the dummy structures are embodied as respective shared zones.

In accordance with a concomitant feature of the invention, the dummy structures have a layout structure in regions of the chip area over which the dummy structures extend, the layout structure, includes:

an oxide, the substrate having trenches formed therein and the oxide disposed in and filling the trenches resulting in oxide-filled trenches;

zones formed of polysilicon disposed on the substrate over an area of the oxide-filled trenches, the zones formed of polysilicon covering only part of the area of the oxide-filled trenches, the oxide-filled trenches and the zones formed of polysilicon disposed contiguously over an entire region of the chip area over which the dummy structures extend and enclose regions not having the oxide-filled trenches and the zones formed of polysilicon, the regions disposed at regular intervals and are oriented parallel in regards to each other;

doping zones disposed in the substrate in the regions surrounded by the zones formed of polysilicon and the oxide-filled trenches;

the electrically conductive contact points applied to the doping zones and, via the doping zones, establish electrically conductive connections with the substrate, the electrically conductive contact points covering only a part of each of the doping zones;

the metal interconnects of the metallization plane are strip shaped metal interconnects oriented in a cruciform fashion at regular intervals and, in each direction, parallel to one another, and are disposed such that the metal interconnects of the metallization plane are situated in each case at right angles to one another forming crossover areas which are situated in each case above one of the electrically conductive contact points and cover the electrically conductive contact points; and the metal interconnects of the metallization plane are electrically conductively connected to the electrically conductive contact points in a region of the crossover areas.

Other features which are considered as characteristic for the invention are set forth in the appended claims.

Although the invention is illustrated and described herein as embodied in an integrated semiconductor chip with modular dummy structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view through modular dummy structures up to and including a metallization plane according to the invention; and FIG. 2 is a plan view of a layout structure of part of a chip area over which the modular dummy structures extend.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a cross sectional view through modular dummy structures of all relevant process planes up to and including metal interconnects of a metallization plane 5. In order to be able to fulfill the objectives mentioned in the introduction as well as possible, the construction and the structure of the modular dummy structures should be the same as the construction and the structure of active regions of a chip. The configuration of the various dummy structures illustrated in cross section is thereby defined to a large extent.

The modular dummy structures include a multiplicity of electrically conductive contact points 1 between the metal interconnects of the metallization plane 5 and a substrate 6 in regions of the chip area over which the modular dummy structures extend. The dummy structures include a multiplicity of mutually identical sections A. The electrically conductive contact points 1 are disposed between the metal interconnects of the metallization plane 5 and the substrate 6 in each of the sections A. Each of the mutually identical sections A includes a portion of the substrate 6 corresponding to the size of the respective section A, zones formed of polysilicon 2 that are situated above the substrate 6, a doping zone 3 disposed in the substrate 6 and spaced apart from the zones with the polysilicon 2, and an electrically conductive contact point 1 that is electrically conductively connected to the doping zone 3 and to the metal interconnects of the metallization plane 5. Respective oxide-filled trenches 4 are disposed in the substrate 6 underneath the zones with the polysilicon 2. The zones with the polysilicon 2 and the oxide-filled trenches 4 of neighboring sections of the multiplicity of mutually identical sections of the dummy structures are embodied as respective shared zones.

Dummy structures for homogenizing the areal occupancy of a chip have not been used electrically heretofore. Therefore, there have also not been any electrically conductive connections between the substrate 6 and the process planes situated above the latter in the regions of a chip area over which the dummy structures extend. Metal interconnects of the metallization plane 5 are applied in the regions of the chip area over which the modular dummy structures extend. In order to homogenize the substrate potential of the chip, the metal interconnects are electrically conductively connected to the substrate 6 via the electrically conductive contact points 1 and the doping zones 3. The doping zones 3 in this case include zones with heavily doped silicon. For their part, the metal interconnects of the metallization plane 5 are at reference-ground potential (for example, "GND") during operation of the semiconductor chip. The substrate potential is constantly kept at reference-ground potential by virtue of the extensive electrically conductive connection between the metal interconnects of the metallization plane 5 and the substrate 6. In addition, there is a further improvement in the homogenization of the areal occupancy of the chip by use of the applied metal interconnects of the metallization plane 5. The voltage supply of all the components applied on the substrate 6 over the entire chip area becomes more homogeneous. By virtue of a uniform substrate potential, the conduction capacitances between a wiring plane 7 situated above the dummy structures 1–5 and the substrate 6, which codetermine the wave guiding properties in the wiring plane 7, are distributed more uniformly over the entire chip area. The wave guiding properties in the wiring planes 7 are thereby homogenized and improved. This has the effect of assisting reliable operation of the chip, since wave propagation properties of voltage or current pulses on the chip become more predictable. Moreover, the "latch-up" effect is effectively suppressed by a homogeneous substrate potential.

By virtue of a configuration of this type, neither an additional chip area nor an additional process step is necessary for homogenizing the substrate potential. No additional chip area is required since the modular dummy structures 1–5, which, as explained above, are already used for homogenizing the areal occupancy, acquire just one further function in that now they are also used for electrical purposes. There is no need for an additional process step since previously provided dummy patterns are now electrically conductive in the form of the contact points 1 but remain the same in terms of their geometrical form and configuration. Electrical contacts are necessary in the active regions of the chip, for example in order to make contact with components, so that the process step necessary for this purpose is merely extended to the areas of the chip over which dummy structures 1–5 extend. In terms of their construction, the electrically conductive contact points 1 in this case correspond to the contacts in the active regions of the chip. The process step for disposing the metal interconnects of the metallization plane 5 corresponds to the process step in which the metallization layer is applied in the active regions of the chip.

FIG. 2 shows a layout structure of part of a chip area over which the dummy structures 1–5 extend. A cross section through the dummy structures 1–5 along a line I—I is shown diagrammatically in the illustration according to FIG. 1. A section A from FIG. 1 is identified by a dashed line in FIG. 2. One possible embodiment of a layout structure with the modular dummy structures is explained with reference to the relevant process planes of the chip which are illustrated in cross section in FIG. 1.

The substrate 6 of the semiconductor chip has the oxide-filled trenches 4 (not completely visible), on which the zones with the polysilicon 2 are applied, the regions covering only part of the area of the oxide-filled trenches 4. The oxide-filled trenches 4 and the zones with the polysilicon 2 applied thereon are disposed contiguously over the entire regions of the chip area over which the dummy structures 1–5 extend, in which case they enclose regions which do not have oxide-filled trenches 4 and the zones with the polysilicon 2 and are disposed at regular intervals and are oriented parallel. Within such a region that is surrounded by the zones with the polysilicon 2 and the oxide-filled trenches 4, the doping zones 3 are disposed in the substrate 6 of the semiconductor chip. Within such a region of the doping zone 3, the electrically conductive contact points 1 are applied to the doping zone 3 and, via the respective doping zone 3, establish electrically conductive contact-making with the substrate 6 of the semiconductor chip, in which case they cover only part of the region. Strip-type metal interconnects of the metallization plane 5, which are oriented in a cruciform fashion at regular intervals and, in each direction, parallel to one another, are disposed in such a way that the metal interconnects of the metallization plane 5 which are situated in each case at right angles to one another form crossover areas which are situated in each case above one of the contact points 1 and cover the latter. The metal interconnects of the metallization plane 5 are electrically conductively connected to the contact points 1 in the region of the crossover areas.

In the exemplary embodiment, the doping zone 3 is composed of $p^+$-doped silicon and the substrate 6 is composed of $p^-$-doped silicon. However, an embodiment with $n^+$-doped silicon in the doping zone 3 and $n^-$-doped silicon in the substrate 6 is also possible.

We claim:

1. An integrated semiconductor chip, comprising:
    a substrate; and
    modular dummy structures disposed on said substrate and include a metallization plane with metal interconnects and a multiplicity of electrically conductive contact points disposed between said metal interconnects of said metallization plane and said substrate in areas of a chip area over which said dummy structures extend;
    said metal interconnects of said metallization plane being electrically conductively connected to said multiplicity of said electrically conductive contact points.

2. The integrated semiconductor chip according to claim 1, wherein said modular dummy structures include a multiplicity of mutually identical sections, and one of said multiplicity of electrically conductive contact points is disposed between said metal interconnects of said metallization plane and said substrate in each of said multiplicity of mutually identical sections.

3. The integrated semiconductor chip according to claim 1, wherein said dummy structures have a layout structure in regions of the chip area over which said dummy structures extend, said layout structure, including:
    an oxide, said substrate having trenches formed therein and said oxide disposed in and filling said trenches resulting in oxide-filled trenches;
    zones formed of polysilicon disposed on said substrate over an area of said oxide-filled trenches, said zones formed of polysilicon covering only part of the area of said oxide-filled trenches, said oxide-filled trenches and said zones formed of polysilicon disposed contiguously over an entire region of the chip area over which said dummy structures extend and enclose regions not having said oxide-filled trenches and said zones formed of polysilicon, said regions disposed at regular intervals and are oriented parallel in regards to each other;
    doping zones disposed in said substrate in said regions surrounded by said zones formed of polysilicon and said oxide-filled trenches;
    said electrically conductive contact points applied to said doping zones and, via said doping zones, establish electrically conductive connections with said substrate, said electrically conductive contact points covering only a part of each of said doping zones;
    said metal interconnects of the metallization plane are strip shaped metal interconnects oriented in a cruciform fashion at regular intervals and, in each direction, parallel to one another, and are disposed such that said metal interconnects of said metallization plane are situated in each case at right angles to one another forming crossover areas which are situated in each case above one of said electrically conductive contact points and cover said electrically conductive contact points; and
    said metal interconnects of said metallization plane are electrically conductively connected to said electrically conductive contact points in a region of said crossover areas.

4. The integrated semiconductor chip according to claim 2, wherein each of said multiplicity of mutually identical sections, includes:
    a portion of said substrate corresponding to a size of a respective section of said multiplicity of mutually identical sections;
    zones formed of polysilicon disposed above said substrate;
    a doping zone disposed in said substrate and spaced apart from said zones formed of polysilicon; and
    one of said multiplicity of electrically conductive contact points electrically conductively connected to said doping zone and to said metal interconnects of said metallization plane.

5. The integrated semiconductor chip according to claim 4, wherein said substrate has trenches formed therein disposed underneath said zones formed of polysilicon and including an oxide filling said trenches resulting in oxide-filled trenches.

6. The integrated semiconductor chip according to claim 4, wherein said doping zone and said substrate are composed of doped silicon having a same doping polarity, said doped silicon in said doping zone being doped with a high concentration and said do ped silicon in said substrate being doped with a low concentration.

7. The integrated semiconductor chip according to claim 5, wherein said zones formed of polysilicon and said oxide-filled trenches of neighboring sections of said multiplicity of mutually identical sections of said dummy structures are embodied as respective shared zones.

* * * * *